United States Patent [19]

Chu et al.

[11] 4,032,033

[45] June 28, 1977

[54] METHODS AND APPARATUS FOR HEATING ARTICLES

[75] Inventors: Tze Yao Chu; Yogesh Jaluria, both of Lawrence Township, Mercer County; Peter Frederick Lilienthal, II, Princeton; George Michael Wenger, Franklin Township, Somerset County, all of N.J.

[73] Assignee: Western Electric Company, Inc., New York, N.Y.

[22] Filed: Mar. 18, 1976

[21] Appl. No.: 668,012

[52] U.S. Cl. .............................. 228/200; 228/201; 228/242; 134/11; 134/31; 134/75; 134/108
[51] Int. Cl.² .................. H05K 3/34; B23K 3/04
[58] Field of Search .......... 228/200, 239, 242, 201; 134/11, 26, 30, 31, 105, 107, 108, 109, 75

[56] References Cited

UNITED STATES PATENTS

| | | | |
|---|---|---|---|
| 3,001,532 | 9/1961 | Plassmeyer | 134/108 |
| 3,028,267 | 4/1962 | Edhofer et al. | 134/105 X |
| 3,106,928 | 10/1963 | Rand | 134/30 X |
| 3,229,702 | 1/1966 | Murdoch, Jr. | 134/109 X |
| 3,375,177 | 3/1968 | Rand | 134/12 X |
| 3,881,949 | 5/1975 | Brock | 134/31 |
| 3,904,102 | 9/1975 | Chu et al. | 228/242 X |

FOREIGN PATENTS OR APPLICATIONS 2,014,177   10/1971   Germany ........................ 228/200

Primary Examiner—James L. Jones, Jr.
Assistant Examiner—K. J. Ramsey
Attorney, Agent, or Firm—D. J. Kirk

[57] ABSTRACT

Articles are heated in a condensation heat transfer facility to effect soldering thereof by transporting said articles into a body of hot saturated vapor within the facility. The hot saturated vapor condenses on, and gives up latent heat of vaporization to, the articles to effect solder reflow. The articles are subsequently quenched in a liquid prior to the withdrawal of the articles from the facility.

7 Claims, 5 Drawing Figures

METHODS AND APPARATUS FOR HEATING ARTICLES

BACKGROUND OF THE INVENTION

1. FIELD OF THE INVENTION

This invention relates to the heating of articles to elevated temperatures in a condensation heat transfer facility. In particular, the invention is directed to heating such articles that are heat sensitive and can remain above predetermined temperatures for only a limited time.

2. DESCRIPTION OF THE PRIOR ART vaporization relatively

It is well known to heat articles to elevated temperatures in a condensation heat transfer facility. Such a facility is fully described in U.S. Pat. No. 3,904,102 to T. Y. Chu et al. which is assigned to the instant assignee. That facility contains a body of hot saturated vapor of a boiling primary liquid which condenses on an article to be heated to the elevated temperature, transferring its latent heat of varporization thereto. Additionally, the Chu et al. patent describes the use of a secondary body of vapor disposed above the body of relataively expensive hot primary vapor to prevent losses thereof to the atmosphere. This type of facility has been found to be extremely effective in heating a variety of articles for purposes of soldering, brazing, fusing, curing, cooking, testing, etc.

In particular, such a condensation heating facility has been used for reflow soldering operations wherein electrical components are soldered to printed wiring boards or the like. In most of these applications the length of time that the components are in the hot saturated primary vapors is not critical.

However, problems arise when external leads are to be soldered to metallized ceramic substrates in the condensation heat transfer facility. Bonding pad areas on the substrate are formed by deposition of a plurality of thin metallic layers to provide good adhesion to the ceramic as well as a low resistance electrical conductive path. A final layer of gold is deposited on the thin metallic layers to protect the layers and provide a reliable electrical contact. Solder subsequently is applied and reflowed to connect the external leads to the bonding pads.

It has been determined that such metallized substrates and external leads should be heated to an elevated temperature of approximately 50° F. higher than the solder liquidus temperature. Heating to such an elevated temperature is necessary to insure adequate solder reflow required for acceptable bonds. However, when the metallized substrates are raised to such an elevated temperature, the cool-down time is substantially increased and the bond strength of the leads to the substrate deteriorates rapidly. It is believed that such prolonged time above the solder liquidus temperature undesirably causes substantial alloying of both the gold and the underlying thin metallic films which solder, forming intermetallics, resulting in weak or defective bonds.

Once the substrate and the external leads have been heated to the elevated temperature and then moved into the lower temperature secondary vapors, the cooling rate is relatively slow and the substrate temperature remains above the solder liquidus temperature for too long a period resulting in the aforementioned weak bonds. Accordingly, the metallized ceramic substrate and the external leads to be soldered thereto can remain in the condensation heat transfer facility for only a limited time after being heated to the elevated temperature. However, the substrate with the leads bonded thereto must be removed slowly from the facility through the secondary vapor so as to: (1) minimize disruption of the primary-secondary vapor interface, (2) permit drainage of the condensed vapors from the substrate, and (3) lessen drag-out losses of the primary vapors.

SUMMARY OF THE INVENTION

The foregoing problem has been solved by the instant condensation heat transfer facility which incorporates a reservoir of secondary liquid within the facility. The article to be heated is transported into the facility, through the body of secondary vapor and into the body of hot primary vapor where the article is heated to an elevated temperature. The article is then removed from the body of hot primary vapor and immersed in the reservoir of secondary liquid prior to withdrawal from the facility.

Furthermore, immersion of the hot article in the secondary liquid will vaporize portions of the secondary liquid to provide supplemental secondary vapor which aids in maintaining the body of secondary vapor.

Advantageously, such quick cooling or quenching permits the article to be removed slowly from the condensation heat transfer facility without deleteriously affecting said article.

Additionally, immersion in the secondary liquid aids in cleaning unwanted flux and debris from the article.

A further advantage is that such immersion also removes condensed primary liquid remaining on the article thus decreasing drag out losses of the relatively expensive primary liquid to the atmosphere.

DETAILED DESCRIPTION

The instant invention will be described as it relates to soldering external leads to a metallized ceramic substrate. However, the invention is not so limited for any article that is to be heated to an elevated temperature in a condensation heat transfer facility can make use of the instant inventive concepts to limit the amount of time spent above a predetermined temperature while in the facility.

Figure 1:
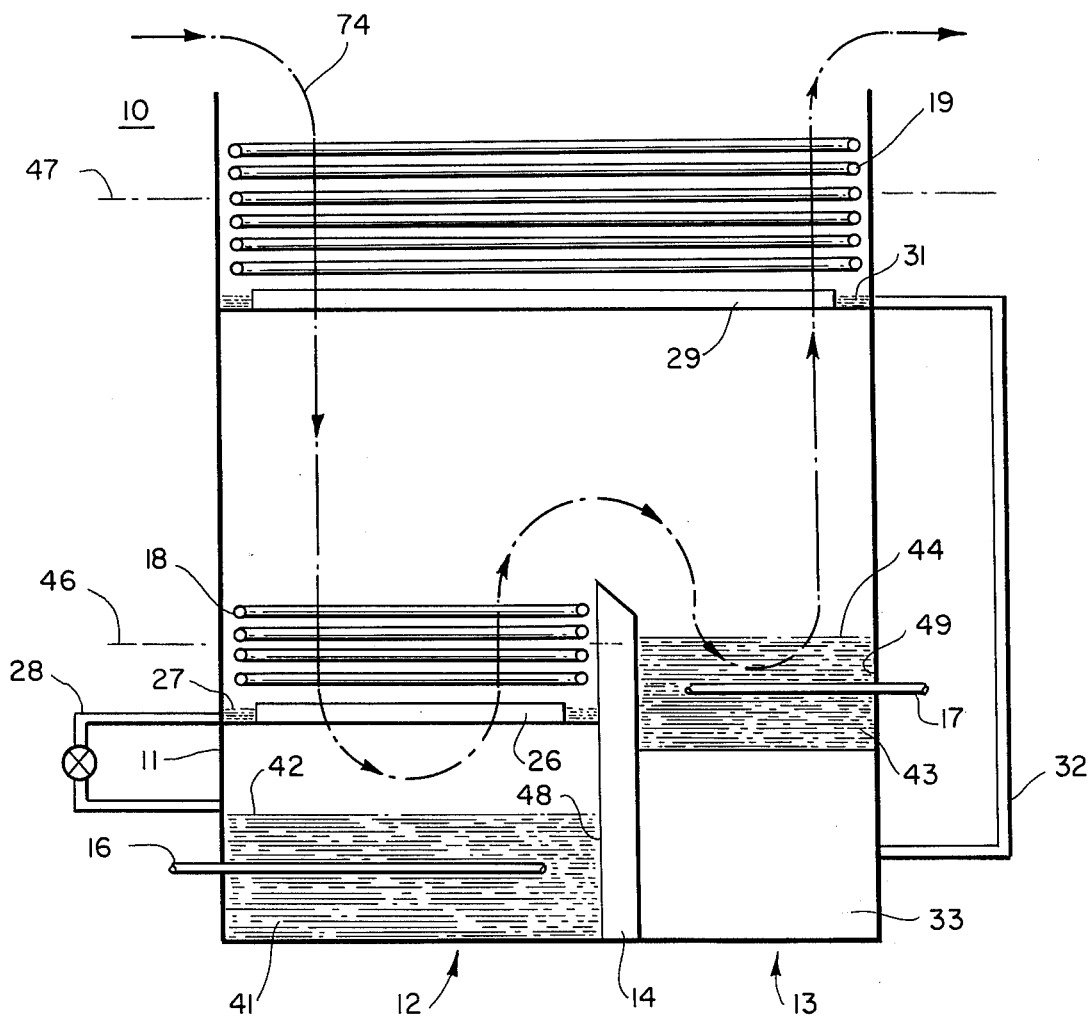
FIG. 1 is a diagrammatic representation of a partial sectional view, in elevation, of a condensation heat transfer facility.

An exemplary embodiment of the instant condensation heat transfer facility, generally indicated by the numeral 10, is shown in FIG. 1. The facility 10 is comprised of a vessel 11 having primary and secondary compartments 12 and 13, respectively, separated by a divider 14. First and second heating coils 16 and 17 are located in the primary and secondary compartments 12 and 13, respectively.

A set of primary cooling coils 18 is located at the upper portion of the primary compartment 12 with a set of secondary cooling coils 19 located at the upper portion of the vessel 11. Both the primary set of cooling coils 18 and the secondary set of cooling coils 19 receive a cooling medium from a cooling source (not shown) with the secndary set of cooling coils operated at a lower temperature than the primary set of cooling coils.

Fixedly mounted around the inner periphery of the primary compartment 12, immediately below the set of primary cooling coils 18, is a primary trough 26 which receives a primary condensate 27 draining off the set of primary cooling coils. A valved line 28 communicates between the primary trough 26 and the lower portion of the primary compartment 12. Similarly, a secondary trough 29 is fixedly mounted around the inner periphery of the vessel 11 immediately below the set of secondary cooling coils 19 to receive a secondary condensate 31 draining off the secondary set of cooling coils 19. A return line 32 connects the secondary trough 31 to a pump 33 located in the lower portion of the secondary compartment 13.

In operation, a primary heat transfer liquid 41 is introduced into the primary compartment 12 of the vessel 11 to a level generally indicated by the numeral 42, and a secondary heat transfer liquid 43 is introduced into the secondary compartment 13 to a level indicated by the numeral 44.

The primary heat transfer liquid 41 is characterized by the following general properties:

a. A boiling point at atmospheric pressure at least equal to, and preferably above, the temperature required for the operation to be performed (i.e., soldering, fusing, brazing, curing, cooking, etc.). For example, in a soldering operation, this boiling point is preferably at least 50° F. above the solder liquidus temperature of the solder used in the operation.

b. Must produce a saturated vapor which is denser than air at atmospheric pressure.

c. Desirably has a well defined and substantially constant boiling point for better control over the process.

d. Desirably produces a saturated vapor which is non-oxidizing, chemically stable and inert, non-toxic and non-flammable.

In addition to the general properties hereinabove recited, when the process is employed on an article such as a metallized ceramic substrate having a plurality of external leads to be soldered thereto, the primary heat transfer liquid 41 should not be electrically conducting.

The primary heat transfer liquid 41 advantageously is selected from the group of liquids known generically as fluorocarbons. One such liquid is sold by E. I. DuPont de Nemours and Co. under the tradename "FREON E5" and has the following significant properties:

Boiling point at atmospheric pressure — 435.6° F. (224.2° C.)
Electrical resistivity — greater than 4 ×10$^{14}$ ohm-cm.
Dielectric constant — 2.45
Latent heat of vaporization — 19.9 BTU/pounds
Density of saturated vapor at boiling point and atmospheric pressure — 1.45 pounds/ft.$^3$
Chemical stability, inertness, non-toxicity, non-flammability.

Another suitable primary heat transfer liquid is sold by Minnesota Mining and Manufacturing Co. under the tradename "FLUORINERT FC-70" and has the following significant properties:

Boiling point at atmospheric pressure — 419° F. (215° C.)
Dielectric constant — 1.94
Latent heat of vaproization — 23 BTU/pound
Density of saturated vapor at boiling point and atmospheric pressure — 1.27 pound/ft.$^3$
Chemical stability, inertness, non-toxicity, non-flammability.

The secondary heat transfer liquid 43 is characterized by the following general properties:

a. A lower boiling point at atmospheric pressure than the primary heat transfer liquid 41.

b. Produces a vapor which, for the embodiments disclosed herein is, at atmospheric pressure, less dense than the saturated vapor from the primary heat transfer liquid 41 at atmospheric pressure and which is denser than air at atmospheric pressure and at the same temperature.

c. Does not form an azeotrope with the primary heat transfer liquid 41.

d. Produces a saturated vapor which does not support a high equilibrium moisture content.

e. Produces a saturated vapor which is non-oxidizing, chemically stable, non-toxic and non-inflammable.

In addition to the general properties hereinabove recited, when the process is employed on an article such as a metallized ceramic substrate having a plurality of external leads to be soldered thereto, the secondary heat transfer liquid 43 should not be electrically conducting.

A suitable secondary heat transfer liquid 43 adapted for use in the manner hereinbefore described with either FREON E5 or FLUORIENT FC-70 as the primary heat transfer liquid 41 advantageously is selected from the group of liquids known generically as halogenated hydrocarbons such as trichloro-trifluoro-ethane. Such a liquid is sold by E. I. DePont de Nemours and Co. under the tradename "FREON TF" and has the following significant properites:

Boiling point at atmospheric pressure — 117.6° F. (47.6° C.)
Electrical resistivity — greater than 2 × 10$^{15}$ ohm-cm.
Dielectric constant — 2.41
Latent heat of vaporization — 63.12 BTU/pound
Density of saturated vapor at boiling point and atmospheric pressure — 0.461lpound/ft.$^3$
Substantial chemical stability, very low toxicity, non-flammability.

The facility 10 shown in FIG. 1 employs FLUOROINERT FC-70 as the primary heat transfer liquid 41 and FREON TF as the secondary heat transfer liquid 43. The primary set of cooling coils 18 is operated at approximately 125° F. (51.7° C.) and the secondary set of cooling coils 19 at approximately 40° F. (4.4° C.).

To "start up" the facility 10, heat may be applied by heating coils 16 and 17 to cause both the primary heat transfer liquid 41 and the secondary heat transfer liquid 43 to boil to produce vapors therefrom. Supplementary heaters, such as hot plates (not shown), may be used to bring the primary liquid 41 and the secondary liquid 43 to a boil. A body of hot saturated primary vapors will extend from the surface 42 of the primary heat transfer liquid 41 up to approximately a level indicated by a first phantom line 46. A secondary body of vapors of the secondary heat transfer liquid 43 will substantially fill the remaining portion of the vessel 11 above the phantom line 46 and the secondary heat transfer liquid level 44 up to a level indicated by a second phantom line 47.

The condensate 27 draining off the surface of the set of primary cooling coils 18, essentially primary liquid, is collected in the primary trough 26 and is returned to the lower portion of the primary compartment 12, above the level 42 of the primary liquid 41, through the valved line 28 to form a first reservoir 48 of primary liquid.

The secondary condensate 31 draining off the surface of the set of secondary cooling coils 19, essentially secondary liquid, is collected in the secondary trough 29 and is returned through the return line 32 via the pump 33 to the upper portion of the secondary compartment 13 to form a second reservoir 49 of secondary liquid. A filter (not shown) may be associated with the pump 13 to remove dirt, flux, or other contaminants from the secondary condensate 31.

Figure 2:
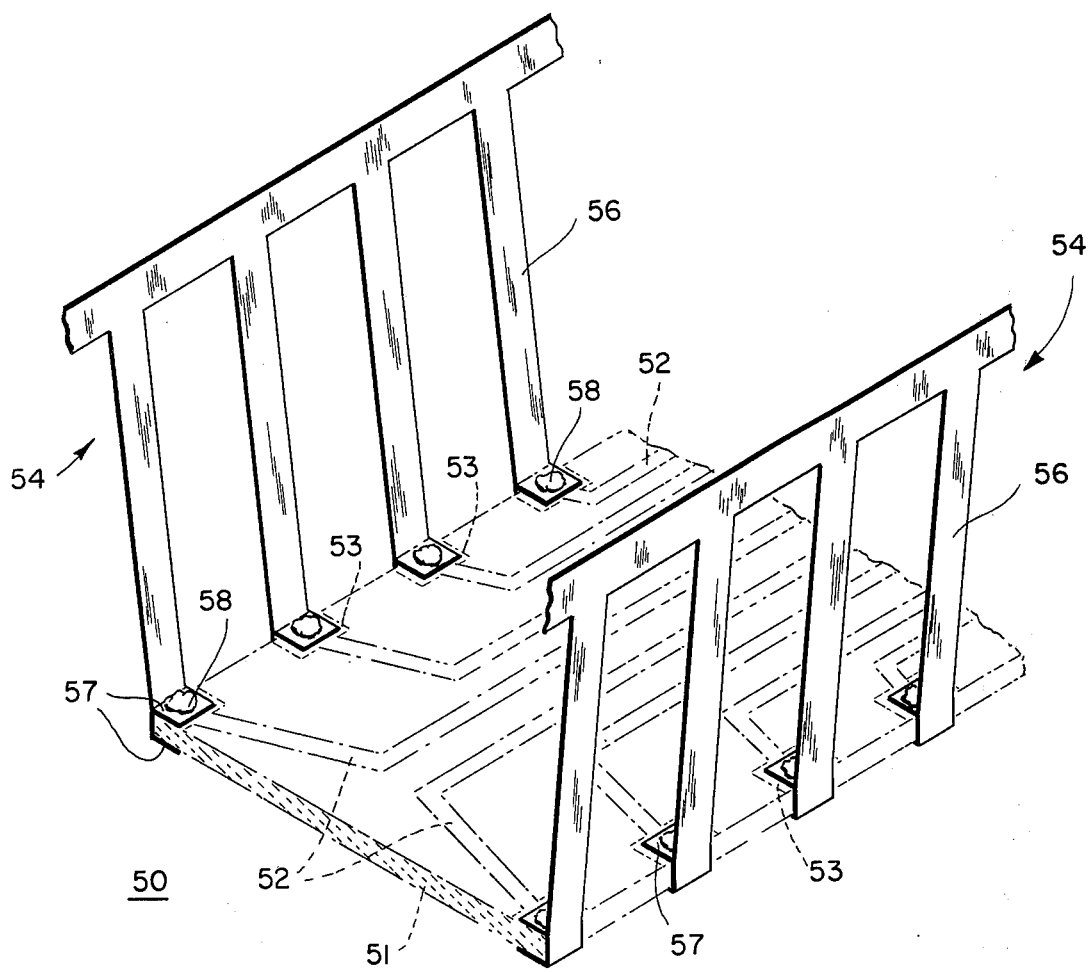
FIG. 2 is an isometric view of a metallized substrate with a lead frame clamped thereto.

The operation of a specific application of the instant invention will be described in connection with soldering, although it is not so limited. FIG. 2 depicts a Hybrid Integrated Circuit (HIC), generally indicated by the numeral 50, comprised of a ceramic substrate 51 with a plurality of gold plated leads 52—52 deposited thereon. The leads 52—52 terminate at a plurality of gold pads 53—53 located along the lateral edges of the substrate 51. A pair of lead frames generally indicated by the numerals 54—54 having a plurality of leads 56—56 each having a pair of times 57—57 at the ends thereof are clamped onto the substrate 51 to make a good physical connection at the gold pads 53—53. A solder blob 58 is located on each tine 57 that contacts one of the gold pads 53—53. Once the lead frames 54—54 have been clamped to the substrate 51, the solder blobs 58—58 are subjected to heat to reflow the solder onto the pads 53—53 to obtain a good electrical and mechanical connection. The solder reflow takes place in the condensation heat transfer facility 10 shown in FIG. 1.

Figure 3:
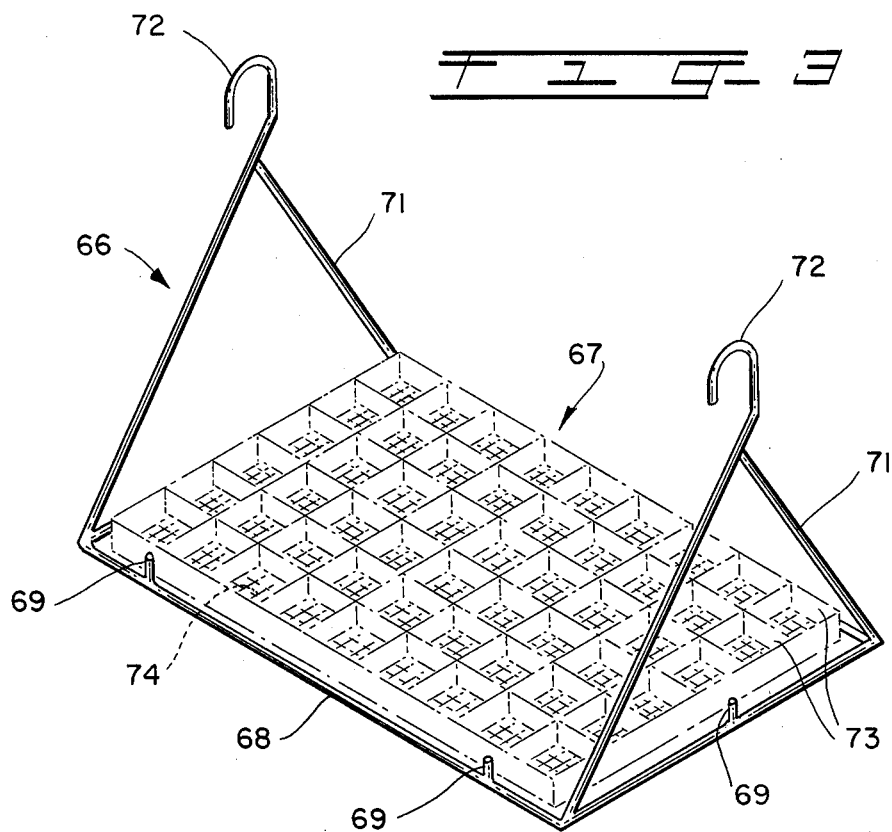
FIG. 3 is an isometric view of a hanger and tray in which articles are placed for transportation through the condensation heat transfer facility.

In order to increase the number of HIC's 50—50 that can be placed in the facility 10 during a single cycle, a hanger assembly and a tray (see FIGS. 3 and 4), generally designated by the numerals 66 and 67, respectively, are used. The hanger 66 has a base 68 with a plurality of right angle tabs 69—69. One leg of each tab 69 extends vertically from the plane of the base 69 to prevent lateral movement of the tray 67 while the other leg of each tab lies in the plane of the base to support the tray. At opposed ends of the base 68, a pair of arms 71—71 extend upwardly and each terminate in a hooked-end section 72.

Figure 4:
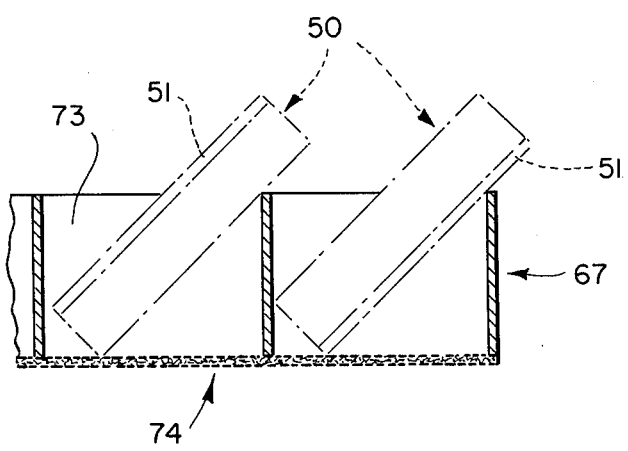
FIG. 4 is a partial cross-sectional view of the tray containing articles.

FIG. 4 is a cross-sectional view, in elevation, of a portion of the tray 67. As can be clearly seen, the tray 67 is "egg crate" shaped with a plurality of compartments 73—73 with a bottom 74 comprised of a screen or other open mesh arrangement. The HIC's 50—50 are placed in the compartments 73—73 with the metallized portion of the substrate 51 either facing up or down with the substrate at an angle to the horizontal to (1) facilitate drainage of the condensed vapors and (2) improve the packing density of the HIC's. Although the HIC's 50—50 can be placed at any angle from 0° to 90°, the optimum angle for the best drainage and packing density while avoiding running of the molten solder off the bonding pads 53—53 has been found to be about 45°.

Once loaded with the HIC's 50—50, the tray 67 is placed on the tabs 69—69 of the hanger assembly 66 and the hooked end sections 72—72 attached to a conveyor (not shown). The hanger assembly 66 and the tray 67 are then conveyed into and through the condensation heat transfer facility 10 in the path indicated by a dashed line 74 shown in FIG. 1.

The tray 67 containing the HIC's 50—50 is lowered into the facility 10 (see FIG. 1), through the body of secondary vapor, and into the body of hot primary vapors. The temperature of the hot primary vapor is approximately 419° F. (215° C.).

The HIC's 50—50 must remain in the body of hot saturated primary vapor long enough to raise the temperature of the solder blobs 58—58 to approximately 50° F. above the solder liquidus temperature of approximately 360° F. (182.2° C.). The HIC's 50—50 can be heated above the solder liquidus temperature for 4 seconds, but less than 7 seconds. Limiting the time HIC's 50—50 are above the solder liquidus temperature will preclude the formation of intermetallics with thin metal films (not shown) underlying the gold pads 53—53 and result in acceptable bonds. However the HIC's 50—50 will attain an elevated temperature of about 419° F. (215° C.) in the body of primary vapor. There is insufficient time to withdraw the hanger assembly 66 with the HIC's 50—50 from the facility 10, for the assembly must be withdrawn slowly in order not to disrupt the primary-secondary vapor and the secondary vapor-atmosphere interfaces or cause undesirable drag-out losses. Additionally, removal of the HIC's 50—50 from the body of hot primary vapors into the body of secondary vapors will not cool the HIC's fast enough to preclude the aforementioned deleterious effects, for the cooling rate of the HIC's in the body of secondary vapors is approximately 10° F. (5.55° C.) per second which will add another 6 seconds to the time above the solder liquidus temperature.

Accordingly, in order to quickly cool or quench the HIC's 50—50 and the molten solder while still inside the facility 10, the tray 67, with the HIC's 50—50, therein is moved from the body of hot saturated vapors, through a portion of the body of secondary vapor and then immersed in the secondary heat transfer liquid 43 in the second reservoir 49. Advantageously, the heat transfer characteristics of the secondary liquid 43 are greater than the secondary vapor, and where the secondary liquid is TF FREON, the cooling rate of the immersed HIC's 50—50 is approximately 260° F. (144.4° C.) per second. After cooling, the HIC's 50—50 may then be slowly removed through the body of secondary vapor and out of the facility 10. The cooled HIC's 50—50 may also dwell in the secondary body of vapor to permit any secondary liquid thereon to drain therefrom. The temperature of the secondary body of vapor being considerably below the solder liquidus temperature permits a relatively slow travel of the HIC's therethrough.

Figure 5:
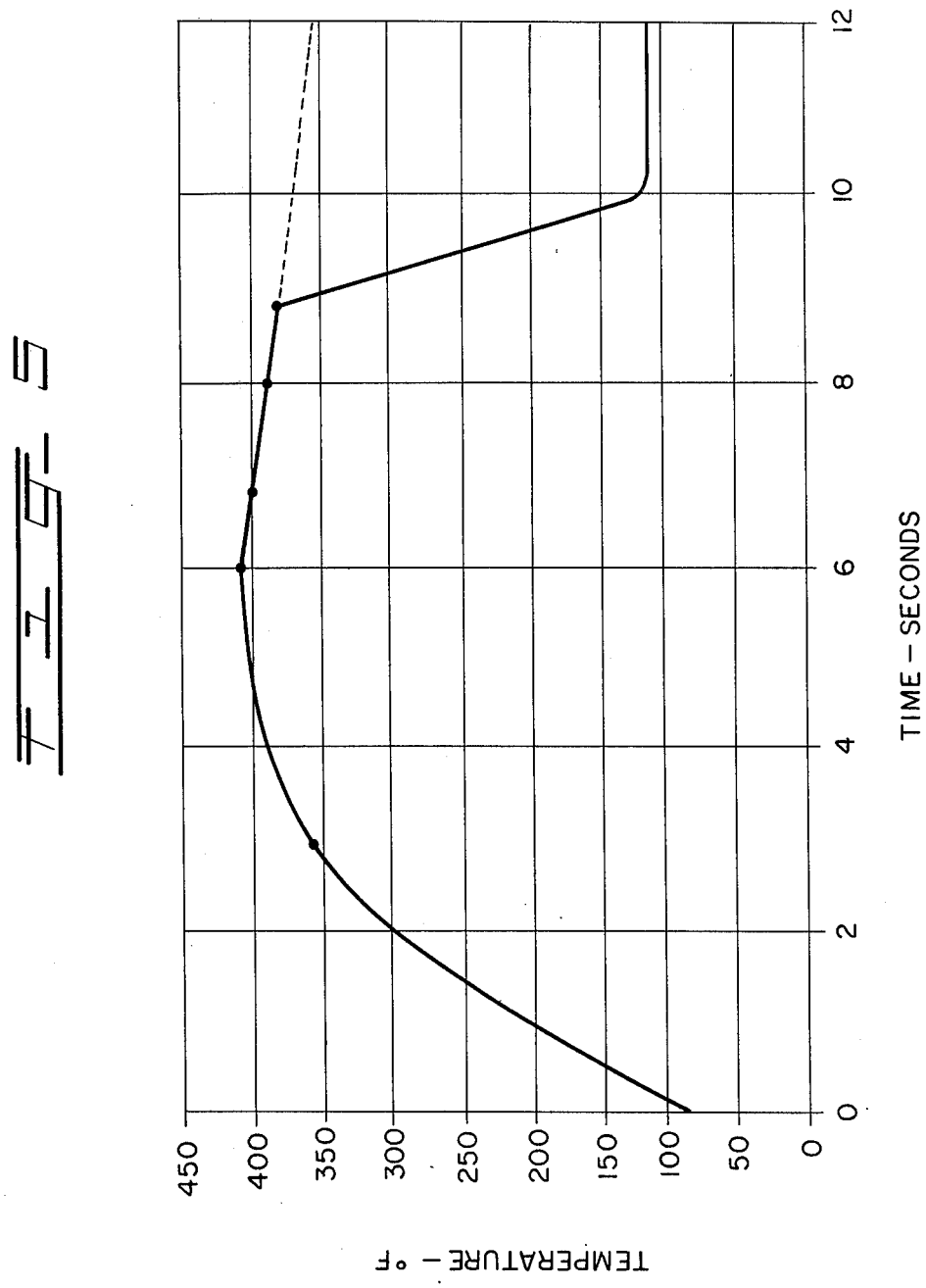
FIG. 5 is a temperature versus time plot of the article as it moves through the condensation heat transfer facility.

FIG. 5 is a temperature versus time plot of a HIC 50 moving through the facility 10 along the path indicated by the line 74. Approximately 3 seconds after entering the facility, the HIC 50 has reached the solder liquidus temperature of 360° F. (182.2° C.). After 3 seconds above the 360° F. (182.2° C.) temperature, a total of approximately 6 seconds in the facility 10, the HIC 50 is removed from the body of hot primary vapors and into the body of secondary vapors. After about 3 seconds in the body of secondary vapor, the HIC 50 is immersed in the secondary liquid 43. Within approximately one second after immersion in the secondary liquid 43, the temperature of the HIC 50 drops from about 380° C.) to 118° F. (47.8° C.) (the boiling temperature of the TF FREON used as a secondary liquid). Thus, the total time that the HIC 50 is above the solder liquidus temperature is 6 seconds which has been found not to cause the aforementioned deleterious intermetallic formations and attendant weak bonds. It should be noted that if there were no immersion of the HIC 50 in the secondary liquid 43, the time above the solder liquidus temperature would be increased to over 7 seconds (see dashed line in FIG. 5) which length of time has been found to be too long and results in the aforementioned unacceptable bonds.

An additional important aspect of the instant invention is that as the HIC's 50—50 (or any other article that may have been heated to an elevated temperature) are quenched, the secondary liquid 43 is caused to boil. The vapor so produced supplements the body of secondary vapor in order to make up a portion of that which is lost to the atmosphere during normal operation of the facility 10.

A further aspect of the instant invention is that the immersion in the secondary liquid cleans unwanted flux and debris from the article and washes off the primary condensate remaining on the articles to substantially lessen drag out losses of the expensive primary liquid. The primary liquid 41 may be reclaimed by filtering the material in the second reservoir 49 and returning it to the first reservoir 48.

What is claimed is:

1. A method for heating an article to an elevated temperature in a condensation heat transfer facility which is open to the atmosphere, comprising the steps of:
   transporting the article into the facility, through a body of secondary vapor, into a body of hot saturated primary vapor;
   heating the article to the elevated temperature by condensing the primary vapor thereon to transfer the latent heat of vaporization to the article;
   removing the article from the hot saturated primary vapor; and
   immersing the article in a liquid prior to withdrawal of said article from the facility.

2. The method of claim 1 wherein the article is a metallized ceramic substrate and is heated for purposes of soldering external leads to said substrate, wherein:
   the heating step elevates the temperature of the substrate above the solder liquidus temperature.

3. The method of claim 2 wherein:
   the immersing step lowers the temperature of the substrate below the solder liquidus temperature.

4. The method as set forth in claim 2 wherein:
   the immersing step is accomplished within six seconds after the article has reached the solder liquidus temperature.

5. The method of claim 1 wherein:
   the immersing step is accomplished in a liquid from which the body of secondary vapor is generated.

6. A method for heating an article to an elevated temperature in a condensation heat transfer facility having a vessel, open to the atmosphere, containing a body of hot saturated primary vapor with a body of secondary vapor interposed between the body of primary vapor and the atmosphere, the method comprising the steps of:
   condensing the hot saturated primary vapor on the article to heat said article to said elevated temperature by transferring the latent heat of vaporization of said condensed primary vapor to said article;
   removing the article from the body of hot saturated primary vapor; and
   simultaneously quenching the article and generating supplemental secondary vapor by immersing said article in a secondary liquid within the vessel.

7. A condensation heat transfer facility for heating an article to an elevated temperature, comprising:
   a vessel, open to the atmosphere;
   a first reservoir, within the vessel to receive a primary liquid having a boiling point equal to the elevated temperature;
   a second reservoir, in juxtaposition to the first reservoir, within the vessel to receive a secondary liquid having a boiling point substantially lower than the elevated temperature;
   means for heating the primary liquid to produce a hot saturated primary vapor therefrom;
   means for heating the secondary liquid to produce a saturated secondary vapor therefrom;
   means for condensing the hot saturated primary vapor above only the first reservoir; and
   means for condensing the secondary vapor, mounted directly above both the primary vapor condensing means and the surface of the secondary liquid.

* * * * *

UNITED STATES PATENT OFFICE
CERTIFICATE OF CORRECTION

Patent No. 4,032,033                Dated June 28, 1977

Inventor(s) T. Y. Chu et al.

It is certified that error appears in the above-identified patent and that said Letters Patent are hereby corrected as shown below:

In the specification, Column 1, lines 13 and 14, "vaporization relatively" should be deleted; line 25, "relataively" should read --relatively--; line 59, "which" should read --with--. Column 3, line 9, "secndary" should read --secondary--. Column 4, line 8, "vaproization" should read --vaporization--; line 37, "FLUORIENT" should read --FLUORINERT--; line 50, "0.4611" should read --0.461--. Column 5, line 31, "times 57-57" should read --tines 57-57--; line 48, "base 69" should read --base 68--. Column 7, line 4, "380°C.)" should read --380°F. (193.3°C.)--.

Signed and Sealed this

Eleventh Day of October 1977

[SEAL]

Attest:

RUTH C. MASON
Attesting Officer

LUTRELLE F. PARKER
Acting Commissioner of Patents and Trademarks